(12) United States Patent
Choi et al.

(10) Patent No.: US 9,142,793 B2
(45) Date of Patent: Sep. 22, 2015

(54) ORGANIC LIGHT EMITTING DIODE DISPLAY

(71) Applicant: SAMSUNG DISPLAY CO., LTD., Yongin-si, Gyeonggi-Do (KR)

(72) Inventors: Hae-Yun Choi, Yongin (KR); Jae-Kyoung Kim, Yongin (KR); Min-Woo Kim, Yongin (KR); Il-Nam Kim, Yongin (KR)

(73) Assignee: Samsung Display Co., Ltd., Yongin-Si (KR)

( * ) Notice: Subject to any disclaimer, the term of this patent is extended or adjusted under 35 U.S.C. 154(b) by 61 days.

(21) Appl. No.: 13/846,901

(22) Filed: Mar. 18, 2013

(65) Prior Publication Data
US 2014/0070182 A1 Mar. 13, 2014

(30) Foreign Application Priority Data
Sep. 11, 2012 (KR) .......................... 10-2012-0100520

(51) Int. Cl.
*H01L 51/52* (2006.01)
*H01L 27/32* (2006.01)

(52) U.S. Cl.
CPC ............ *H01L 51/52* (2013.01); *H01L 27/3246* (2013.01); *H01L 51/5271* (2013.01); *H01L 51/5203* (2013.01)

(58) Field of Classification Search
None
See application file for complete search history.

(56) References Cited

U.S. PATENT DOCUMENTS

| 7,205,715 B2 * | 4/2007 | Park ............................. 313/506 |
| 2005/0046342 A1 * | 3/2005 | Park et al. ..................... 313/504 |

FOREIGN PATENT DOCUMENTS

| JP | 4362147 B2 | 8/2009 |
| KR | 10-2010-0054351 | 5/2010 |

* cited by examiner

*Primary Examiner* — Marcos D Pizarro
(74) *Attorney, Agent, or Firm* — Christie, Parker & Hale, LLP (57) ABSTRACT

An OLED display includes: a substrate; a thin film transistor on the substrate; a first insulation layer on the thin film transistor; a second insulation layer on the first insulation layer, the second insulation layer having a first opening exposing a portion of the first insulation layer; a first electrode electrically connected with the thin film transistor and contacting the second insulation and contacting the first insulation layer through the first opening; a pixel defining layer disposed on the first electrode and having a second opening exposing a portion of the first electrode in a region corresponding to the first opening, the second opening being smaller than the first opening; an organic emission layer on the first electrode in a region corresponding to the second opening; and a second electrode on the organic emission layer in a region corresponding to the second opening.

12 Claims, 12 Drawing Sheets

| Reflector/PDL angle | Reflector 0° /PDL 34° | Reflector 34° /PDL 34° | Reflector 34° /PDL 34° |
|---|---|---|---|
| PDL Refractive index | Ref | EGMM structure | EGMM structure (Cathode-EL layer elimination) |
| Ray tracing | | | |
| Reflector — Refractive index (thickness) | 1.7 ~ 1.9 (20~100nm) | 1.7 ~ 1.9 (20~100nm) | 1.7 ~ 1.9 (20~100nm) |
| Light source — Refractive index | 1.8 | 1.8 | 1.8 |
| EL Layer — Refractive index (thickness) | 1.8 (200~400nm) | 1.8 (200~400nm) | 1.8 (200~400nm) |
| PDL (transmittance of 85%) — Refractive index (thickness) | 1.5~1.7 (2~6 μm) | 1.5~1.7 (2~6 μm) | 1.5~1.7 (2~6 μm) |
| Reflector — Thickness | 50~200nm | Ag 50~200nm | Ag 50~200nm |
| Result(efficiency) | 100.0% | 108.2% | 146.4% |

| Reflector/PDL angle | | Reflector 0° /PDL 34° | Reflector 34° /PDL 34° | |
|---|---|---|---|---|
| PDL Refractive index | | Ref | EGMM structure (Cathode layer elimination) | EGMM structure (Cathode-EL layer elimination) |
| Ray tracing | | | | |
| Reflector | Refractive index (thickness) | 1.7 ~ 1.9 (20~100nm) | 1.7 ~ 1.9 (20~100nm) | 1.7 ~ 1.9 (20~100nm) |
| Light source | Refractive index | 1.8 | 1.8 | 1.8 |
| EL Layer | Refractive index (thickness) | 1.8 (200~400nm) | 1.8 (200~400nm) | 1.8 (200~400nm) |
| PDL (transmittance of 85%) | Refractive index (thickness) | 1.5~1.7 (2~6 μm) | 1.5~1.7 (2~6 μm) | 1.5~1.7 (2~6 μm) |
| Reflector | Thickness | 50~200nm | Ag_50~200nm | Ag_50~200nm |
| Result(efficiency) | | 100.0% | 132.9% | 146.4% |

ORGANIC LIGHT EMITTING DIODE DISPLAY

CROSS-REFERENCE TO RELATED APPLICATION

This application claims priority to and the benefit of Korean Patent Application No. 10-2012-0100520 filed in the Korean Intellectual Property Office on Sep. 11, 2012, the entire contents of which are incorporated herein by reference.

BACKGROUND

1. Field

Embodiments of the present invention generally relate to organic light emitting diode (OLED) displays. More particularly, embodiments of the present invention generally relate to an OLED display in which an organic emission layer is provided in an opening at a location where a pixel defining layer has been partitioned.

2. Description of the Related Art

A display device is a device that can display an image, and currently, organic light emitting diode (OLED) displays are receiving attention.

The above information disclosed in this Background section is only for enhancement of understanding of the background of the described technology and therefore it may contain information that does not form the prior art that is already known in this country to a person of ordinary skill in the art.

SUMMARY

Embodiments of the present invention are directed to an OLED display having improved luminous efficiency.

One aspect of the present invention provides an OLED display including: a substrate; a thin film transistor on the substrate; a first insulation layer on the thin film transistor; a second insulation layer on the first insulation layer, the second insulation layer having a first opening exposing a portion of the first insulation layer; a first electrode electrically connected with the thin film transistor and contacting the second insulation layer and contacting the first insulation layer through the first opening; a pixel defining layer disposed on the first electrode and having a second opening exposing a portion of the first electrode in a region corresponding to the first opening, the second opening being smaller than the first opening; an organic emission layer on the first electrode in a region corresponding to the second opening; and a second electrode on the organic emission layer in a region corresponding to the second opening.

The pixel defining layer may include a plurality of inclined surfaces forming the second opening.

At least one of the organic emission layer and/or the second electrode may be disposed at fewer than all of the plurality of inclined surfaces.

The second opening is in a shape of a flat quadrangle, and wherein the pixel defining layer forms the second opening and may further include first and second inclined surfaces that are disposed opposite to each other; and third and fourth inclined surfaces that are disposed opposite to each other.

The third inclined surface may connect first ends of the first and second inclined surfaces, and the fourth inclined surface may connect the second ends of the first and second inclined surfaces.

The first and second inclined surfaces may be longer than the third and fourth inclined surfaces.

The organic emission layer and the second electrode may be disposed only on the third and fourth inclined surfaces among the first, second, third, and fourth inclined surfaces.

The second electrode may be disposed only on the third and fourth inclined surfaces among the first, second, third, and fourth inclined surfaces.

The organic emission layer may be disposed on the first, second, third, and fourth inclined surfaces.

The organic emission layer may be disposed only on the third and fourth inclined surfaces among the first to fourth inclined surfaces.

The second electrode may be disposed on the first, second, third, and fourth inclined surfaces.

The first electrode may be a light reflective electrode and the second electrode may be a light transmissive electrode.

The organic emission layer may have a refractive index that is different from the refractive indexes of the first electrode, the pixel defining layer, and the second electrode.

According to one of the exemplary embodiments, an OLED display having improved luminous efficiency can be provided.

DETAILED DESCRIPTION

Embodiments of the present invention will be described more fully hereinafter with reference to the accompanying drawings, in which embodiments of the invention are shown. As those skilled in the art would realize, the described embodiments may be modified in various different ways, all without departing from the spirit or scope of the present invention.

In order to clarify embodiments of the present invention, parts that are not connected with the description may be omitted, and the same elements or equivalents may be referred to using similar reference numerals throughout the specification.

In several embodiments, the same reference numerals may be used for the elements having the same configuration to representatively explain the elements in a first embodiment, and only a different configuration from that of the first embodiment may be described in other embodiments.

The size and thickness of each element may be arbitrarily shown in the drawings, and the present invention is not necessarily limited thereto.

In the drawings, the thickness of several layers and regions may be magnified for clarification. In the drawings, the thickness of some of layers and regions may be exaggerated for the sake of explanation. It will be understood that when an element such as a layer, film, region, or plate is referred to as being "on" another element, it can be directly on the other element or intervening elements may also be present.

In addition, unless explicitly described to the contrary, the word "comprise" and variations such as "comprises" or "comprising" will be understood to indicate the inclusion of stated elements but not the exclusion of any other elements. Also, throughout the specification, "on" means that an element is positioned on or above or under or below another element and may not necessarily mean that an element is positioned at an upper side of another element based on a gravitation direction.

A conventional OLED display includes one or more organic light emitting diodes that can display an image by emitting light. An organic light emitting diode includes a first electrode and a second electrode that are disposed opposite to each other, interposed with an organic emission layer and an organic emission layer disposed in an opening located where a pixel defining layer has been partitioned.

In a conventional OLED display, the organic emission layer, the first electrode, and the second electrode may have different refractive indexes and the organic emission layer may function like an optical fiber, and thus a portion of the light emitted from the organic emission layer may be continuously reflected between the first electrode and the second electrode and then emitted to the pixel defining layer disposed in a side of the organic emission layer. This causes deterioration of luminous efficiency of the OLED display.

Hereinafter, an organic light emitting diode (OLED) display according to a first embodiment will be described with reference to FIG. 1, FIG. 2, FIG. 3, and FIG. 4.

Figure 1:
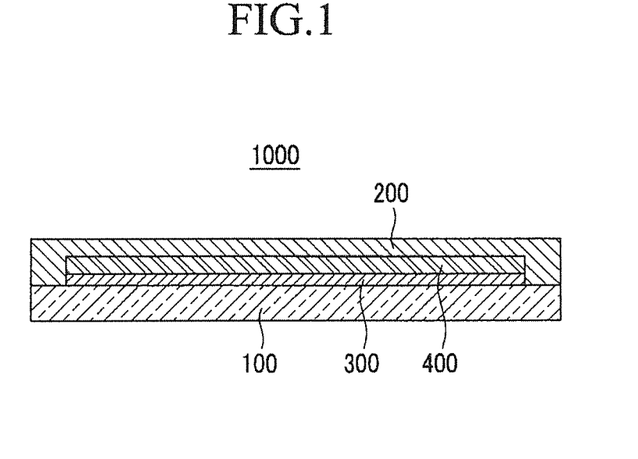
FIG. 1 is a cross-sectional view of an organic light emitting diode (OLED) display according to a first embodiment of the present invention.

FIG. 1 is a cross-sectional view of an OLED display according to the first embodiment of the present invention.

As shown in FIG. 1, an OLED display 1000 according to the first embodiment includes a substrate 100, an encapsulation portion 200, a wiring portion 300, and an organic light emitting diode 400.

The substrate 100 and the encapsulation portion 200 include an insulating material such as glass, polymer, or stainless steel, and one of the substrate 100 and the encapsulation portion 200 is formed of a light transmissive material. The wiring portion 300 and the organic light emitting diode 400 are disposed on the substrate 100, and the encapsulation portion 200 is disposed opposite to the substrate 100, with the wiring portion 300 and the organic light emitting diode 400 interposed between the substrate 100 and the encapsulation portion 200. The substrate 100 and the encapsulation portion 200 may be sealed together in an air-tight manner, interposing the organic light emitting diode 400 therebetween, and the substrate 100 and the encapsulation portion 200 protect the wiring portion 300 and the organic light emitting diode 400 from external interference or the external environment.

The wiring portion 300 includes a switching thin film transistor 10 and a driving thin film transistor 20 (shown, for example, in FIG. 2), and drives the organic light emitting diode 400 by transmitting a signal thereto. The organic light emitting diode 400 emits light according to the signal transmitted from the wiring portion 300.

The organic light emitting diode 400 is disposed on the wiring portion 300.

The organic light emitting diode 400 is disposed in a display area between the substrate 100 and the encapsulation portion 200, and emits light to display an image by the signal transmitted from the wiring portion 300.

Hereinafter, an internal structure of the OLED display 1000 according to the first embodiment will be described with reference to FIG. 2, FIG. 3, and FIG. 4.

Figure 2:
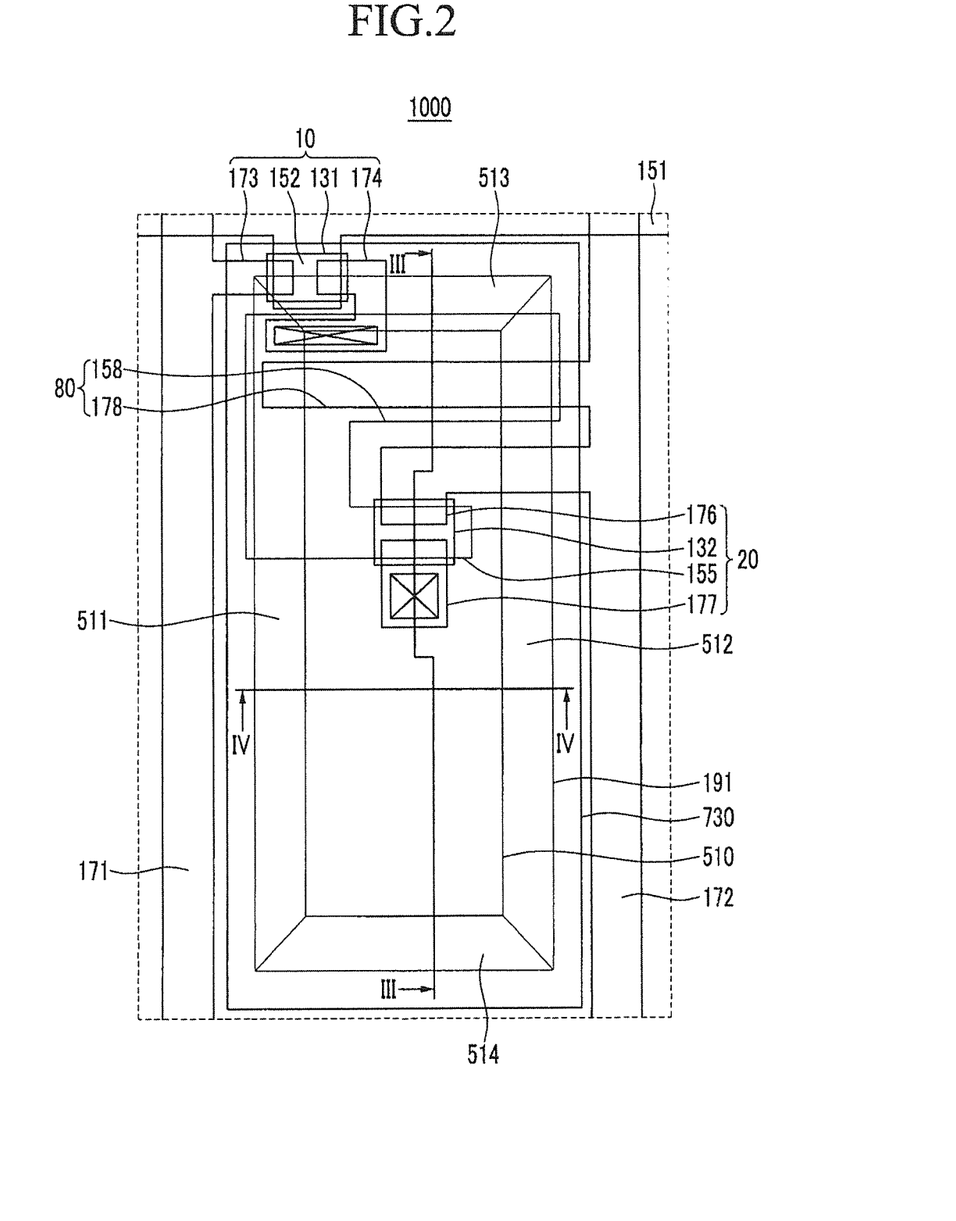
FIG. 2 is a schematic plan view of a pixel structure of the OLED display according to the first embodiment of the present invention.

FIG. 2 is a schematic plan view of a pixel structure of the OLED display according to the first embodiment. FIG. 3 is a cross-sectional view of the pixel structure of the first embodiment shown in FIG. 2, taken along the line III-III. FIG. 4 is a cross-sectional view of the pixel structure of the first embodiment shown in FIG. 2, taken along the line IV-IV.

Figure 3:
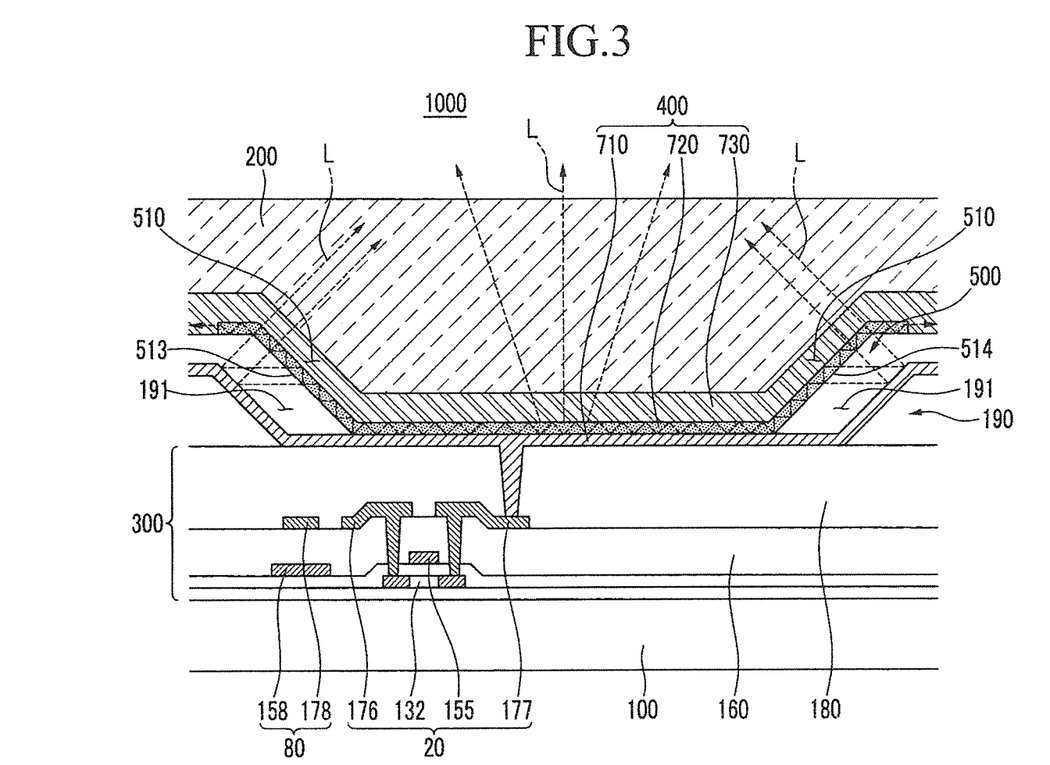
FIG. 3 is a cross-sectional view of the pixel structure of the first embodiment shown in FIG. 2, taken along the line III-III.
Figure 4:
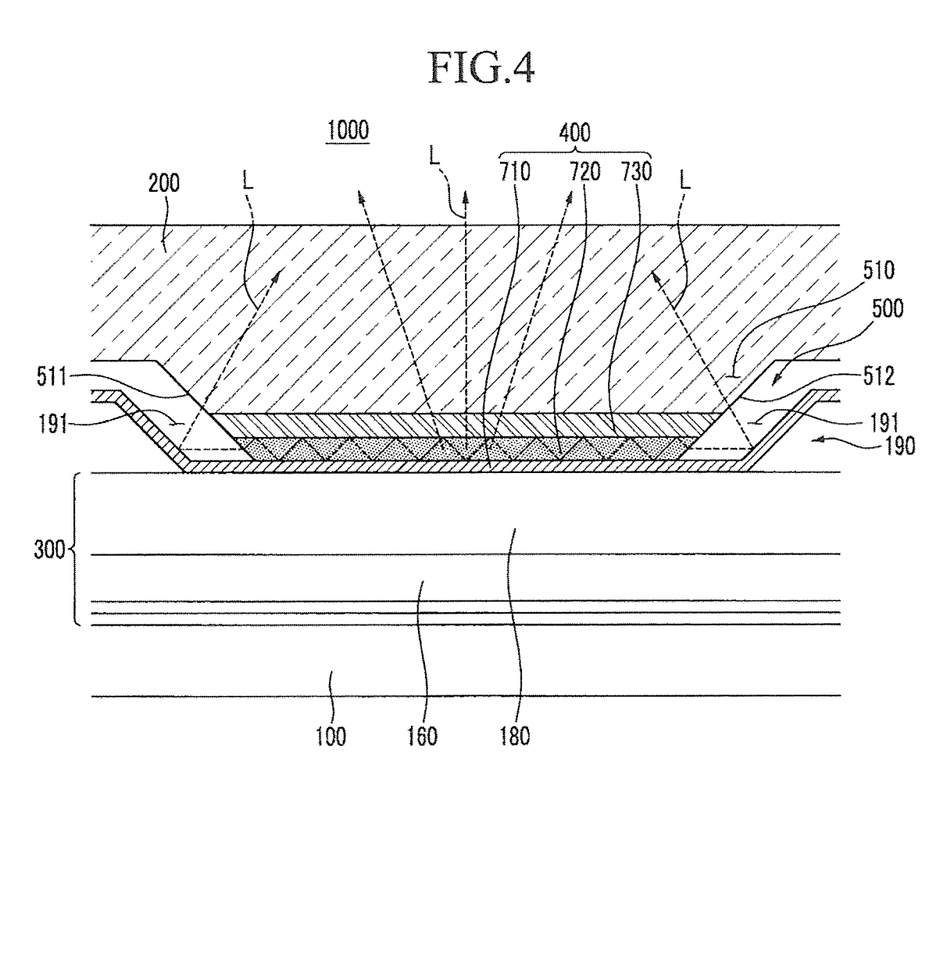
FIG. 4 is a cross-sectional view of the pixel structure of the first embodiment shown in FIG. 2, taken along the line IV-IV.
Figure 5:
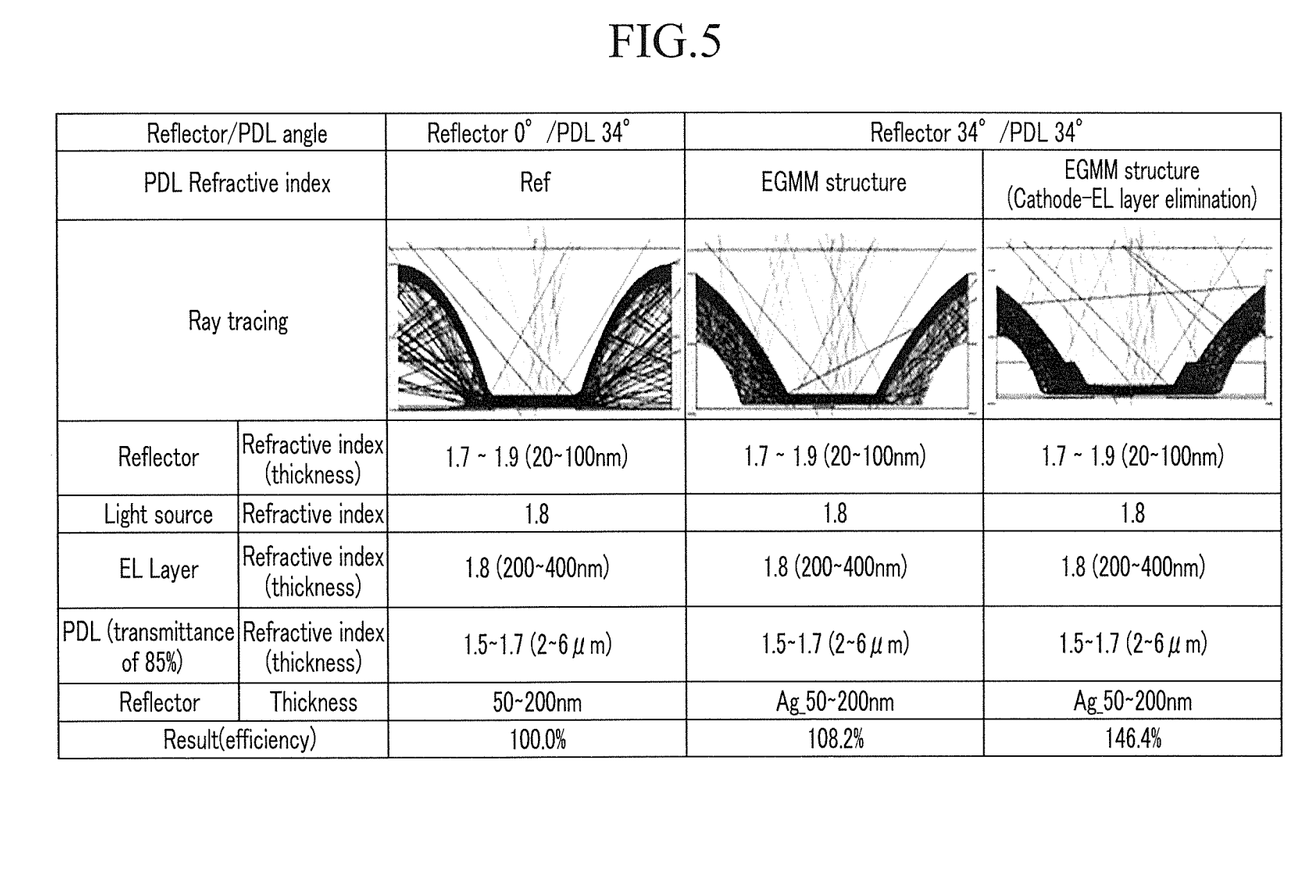
FIG. 5 is a table showing characteristics of a first experimental example, a first comparative example, and a second comparative example of structures of OLEDs.

Hereinafter, the detailed structure of the wiring portion 300 and the organic light emitting diode 400 are illustrated in FIG. 2, FIG. 3, and FIG. 4, but the embodiments of the present invention are not limited to the structures shown in FIG. 2, FIG. 3, and FIG. 4. The wiring portion 300 and the organic light emitting diode 400 may be variously changed within a range that can be easily modified by a person skilled in the art. For example, FIG. 2, FIG. 3, and FIG. 5 show an active matrix (AM) organic light emitting diode display including a pixel having a 2Tr-1Cap structure that includes two thin film transistors (TFTs) 10 and 20 and one capacitor 80, but embodiments of the present invention are not limited thereto. Thus, embodiments of the present invention are not restricted to a particular number of thin film transistors, a particular number of capacitors, and/or a particular number of wires of the OLED display. The pixel illustrated in FIG. 2, FIG. 3, and FIG. 4 represents one possible pixel for displaying an image, and an OLED display displays an image using a plurality of pixels.

As shown in FIG. 2, FIG. 3, and FIG. 4, an OLED display 1000 according to the first embodiment includes a switching thin film transistor 10, a driving thin film transistor 20, a capacitor 80, an interlayer insulation layer 160, an organic light emitting diode 400, a first insulation layer 180, a second insulation layer 190, and a pixel defining layer 500 formed in each pixel. Here, a configuration including the switching thin film transistor 10, the driving thin film transistor 20, and the capacitor 80 may be referred to as the wiring portion 300. In addition, the wiring portion 300 may further include a gate line 151, a data line 171, and a common power line 172 that crosses and that is electrically insulated from the gate line 151. Here, one pixel may be defined by the boundary of the gate line 151, the data line 171, and the common power line 172, but embodiments of the present invention are not limited thereto.

Referring to FIG. 2, the switching thin film transistor 10 includes a switching semiconductor layer 131, a switching gate electrode 152, a switching source electrode 173, and a switching drain electrode 174. Referring to FIGS. 2 and 3, the driving thin film transistor 20 includes a driving semiconductor layer 132, a driving gate electrode 155, a driving source electrode 176, and a driving drain electrode 177.

The switching thin film transistor 10 is used as a switch for selecting a pixel for light emission. The switching gate electrode 152 is connected to the gate line 151. The switching source electrode 173 is connected to the data line 171. The switching drain electrode 174 is separated from the switching source electrode 173, and is connected to one plate 158 of the capacitor 80.

The driving thin film transistor 20 applies driving power for light emission of an organic emission layer 720 of the organic light emitting diode 400 in a selected pixel to the first electrode 710. The driving gate electrode 155 is connected with the capacitor plate 158 that is connected with the switching drain electrode 174. The driving source electrode 176 and the other capacitor plate 178 are respectively connected with the common power source line 172. The first electrode 710 of the organic light emitting diode 400 is disposed to extend to contact the driving drain electrode 177, and the driving drain electrode 177 and the first electrode 710 are electrically connected with each other.

The capacitor 80 includes a pair of capacitor plates 158 and 178 disposed with the interlayer insulation layer 160 interposed therebetween. Here, the interlayer insulation layer 160 may be a dielectric material and capacitance of the capacitor 80 may be determined by charges charged in the capacitor 80 and a voltage between the two capacitor plates 158 and 178.

With such a structure, the switching thin film transistor 10 is driven by a gate voltage applied to the gate line 151 to transmit a data voltage applied to the data line 171 to the driving thin film transistor 20. A voltage corresponding to a difference between a common voltage applied to the driving thin film transistor 20 from the common power line 172 and the data voltage transmitted from the switching thin film transistor 10 is stored in the capacitor 80, and a current corresponding to the voltage stored in the capacitor 80 flows to the organic light emitting diode 400 through the driving thin film transistor 20 such that the organic light emitting diode 400 emits light (e.g., in accordance with the data voltage and the voltage stored in the capacitor).

The organic light emitting diode 400 includes a first electrode 710, a second electrode 730 disposed opposite to the first electrode 710, and an organic emission layer 720 disposed between the first electrode 710 and the second electrode 730. In other words, the first electrode 710, the organic emission layer 720, and the second electrode 730 are sequentially layered from the substrate 100.

The first electrode 710 is a light reflective electrode and a positive electrode which is a hole injection electrode. As described, according to the first embodiment, the organic light emitting diode 400 emits light to a direction toward the encapsulation portion 200 in the OLED display 1000. That is, the OLED display 1000 according to the first embodiment is a top emission type OLED display. The first electrode 710 includes a conductive material such as magnesium-silver (MgAg), aluminum (Al), silver (Ag), indium tin oxide (ITO), indium zinc oxide (IZO), and the like, and is disposed on a first insulation layer 180 and portions of the first electrode 710 may be disposed on a second insulation layer 190.

The first insulation layer 180 is disposed on the switching thin film transistor 10 and the driving thin film transistor 20, and the thickness of the first insulation layer 180 is thinker than that of the interlayer insulation layer 160. The first insulation layer 180 may include an organic material, and may function to planarize the surface of the substrate 100.

The second insulation layer 190 is disposed on the first insulation layer 180 and includes a first opening 191 exposing the first insulation layer 180. The first opening 191 may be formed in the shape of a flat quadrangle, and may be formed by four inclined surfaces forming the flat quadrangular shape. The first electrode 710 is disposed on the first and second insulation layers 180 and 190 through the opening 191 formed in the second insulation layer 190, and accordingly, the first electrode 710 has a recess shape (e.g., the first electrode 710 may be recessed into the opening 191 to contact the first insulation 180 through the opening 191).

The organic emission layer 720 may include a main emission layer where light emission occurs, a hole organic layer disposed between the main emission layer and the first electrode 710, and an electron organic layer disposed between the main emission layer and the second electrode 730. The main emission layer is a layer where holes and electrodes respectively injected from the first electrode 710 and the second electrode 730 are combined, the hole organic layer may include at least one hole injection layer and at least one hole transfer layer, and the electron organic layer may include at least one electron injection layer and at least one electron transfer layer. The main emission layer may include a red emission layer for emitting red light, a green emission layer for emitting green light, a blue emission layer for emitting blue light, and a white emission layer for emitting white light. The second electrode 730, that is, a cathode, is disposed on the organic emission layer 720, and holes and electrons are injected into the organic emission layer 720 respectively from the first electrode 710 and the second electrode 730. When an exciton, in which a hole and an electron injected into the organic emission layer 720 are coupled to each other, falls from an excited state to a ground state, light emission occurs.

The organic emission layer 720 is disposed on the first electrode 710 in a region corresponding to a second opening 510 partitioned by the pixel defining layer 500.

The pixel defining layer 500 is disposed on the first electrode 710 and includes the second opening 510 exposing the first electrode 710 in a region corresponding to the first opening 191 (e.g., in the recessed portion of the first electrode 710). The second opening 510 is smaller than the first opening 191 in size and exposes a smaller area compared to the first opening 191.

The pixel defining layer 500 includes a plurality of inclined surfaces forming the second opening 510, and at least one of the organic emission layer 720 and the second electrode 730 is formed only on a part of the plurality of inclined surfaces (see, e.g., FIG. 4). In further detail, the second opening 510 may be formed in the shape of a flat rectangle, and the pixel defining layer 500 forms the second opening 510 which further includes a first inclined surface 511, a second inclined surface 512, a third inclined surface 513, and a fourth inclined surface 514. The first and second inclined surfaces 511 and 512 are disposed opposite to (e.g., facing) each other, and the third and fourth inclined surfaces 513 and 54 are disposed opposite to (e.g., facing) each other.

The first inclined surface 511, the second inclined surface 512, the third inclined surface 513, and the fourth inclined surface 514 surround the second opening 510 and form the flat rectangular shape of the second opening. The third inclined surface 513 is disposed between first ends of the first inclined surface 511 and the second inclined surface 512 such that the first inclined surface 511 and the second inclined surface 512 are connected by the third inclined surface 513, and the fourth inclined surface 514 is disposed in the other (or second) ends of the first inclined surface 511 and the second inclined surface 512 such that the first inclined surface 511 and the second inclined surface 512 are connected by the fourth inclined surface 514.

The first inclined surface 511 and the second inclined surface 512 have longer lengths compared to the third inclined surface 513 and the fourth inclined surface 514, and accordingly, the second opening 510 has a flat rectangular shape.

According to one embodiment of the present invention, the organic emission layer 720 covers (e.g., completely covers or only covers) the third and fourth inclined surfaces 513 and 514 among the first to fourth inclined surfaces 511 to 514 that form the second opening 510 of the pixel defining layer 500 (see, e.g., FIG. 3), and the organic emission layer 720 is not disposed on (or merely partially covers) the first inclined surface 511 and the second inclined surface 512 (see, e.g., FIG. 4).

The second electrode 730 is disposed on the organic emission layer 720.

The second electrode 730 is a light transmissive electrode and is a cathode electrode that is an electron injection electrode. The second electrode 730 includes a single-layered or multi-layered light transmissive conducting material including a conductive material such as magnesium-silver (MgAg), aluminum (Al), silver (Ag), indium tin oxide (ITO), indium zinc oxide (IZO), and the like.

The second electrode 730 is disposed on the organic emission layer 720 in a region corresponding to the second opening 510. According to one embodiment, the second electrode 730 is disposed to cover (e.g., completely cover or only cover) the third and fourth inclined surfaces 513 and 514 among the first to fourth inclined surfaces 511 to 514 of the second opening 510 of the pixel defining layer 512 and is not disposed on or partially covers the first inclined surface 511 and the second inclined surface 512.

The organic emission layer 720 forming the organic light emitting diode 300 of the OLED display 1000 according to the first embodiment has a refractive index that is different from those of the first electrode 710, the pixel defining layer 500, and the second electrode 730 due to a material characteristic, and, accordingly, the organic emission layer 720 functions like an optical fiber such that a part of light L emitted from the organic emission layer 720 is continuously reflected between the first electrode 710 and the second electrode 730 and then (e.g., before it is) emitted toward the pixel defining layer 500 disposed on a side of the organic emission layer 720. The light L emitted toward the pixel defining layer 500 disposed on the side of the organic emission layer 720 is reflected by the first electrode 710 disposed on the second insulating layer 190 in a region corresponding to (e.g., substantially parallel with or facing) the first and second inclined surfaces 511 and 512 (see, e.g., FIG. 4) and then irradiated toward a center portion of the pixel because the organic emission layer 720 and the second electrode 730 are disposed only on the third inclined surface 513 and the fourth inclined surface 514. Because the organic emission layer 720 and the second electrode 730 are not disposed on the first inclined surface 511 and the second inclined surface 512, the light L reflected by the first electrode 710 is irradiated toward the center portion of the pixel without (or with reduced) luminance deterioration due to the organic emission layer 720 and the second electrode 730, and accordingly, the luminous efficiency of the OLED display 1000 can be improved.

In the OLED display 1000 according to the first embodiment, light L irradiated to the side of the organic emission layer 720 is reflected back to the center area of the pixel by the first electrode 710 without (or with reduced) luminance deterioration due to the organic emission layer 720 and the second electrode 720 so that the luminous efficiency of the entire pixel can be improved.

Improvement of luminous efficiency of the OLED display 1000 according to the first embodiment can be observed through a first experimental example; the first experimental example will now be described. An OLED display in the first experimental example has the same configuration of the OLED display according to the first embodiment.

FIG. 5 is a table illustrating characteristics of the first experimental example, a first comparative example, and a second comparative example according to the present invention.

First, as shown in FIG. 5, the first comparative example ("Ref") is a conventional flat OLED display and includes a first electrode, a pixel defining layer, an organic emission layer, and a second electrode. The first electrode (or "Reflector") has a thickness of 20 nm to 100 nm and has a refractive index of 1.7 to 1.9, and the pixel defining layer (PDL) is disposed on the first electrode, has a surface inclined about 34 degrees that forms an opening, and has a thickness thereof is 2 um to 6 um. The refractive index of the pixel defining layer is 1.5 to 1.7. The organic emission layer (or "EL Layer") is disposed on the first electrode in a region corresponding to the opening and has a thickness of 200 nm to 400 nm and a refractive index of 1.8, and the second electrode is disposed on the organic emission layer and the pixel defining layer.

Next, the second comparative example ("EGMM structure") includes a first electrode, a pixel defining layer, an organic emission layer, and a second electrode. The first electrode is inclined about 34 degrees and thus has a recess shape, and the thickness of the first electrode (or "Reflector") of 20 nm to 100 nm and a refractive index thereof is 1.7 to 1.9. The pixel defining layer (PDL) is disposed on the first electrode and, includes a surface inclined about 34 degrees forming an opening. The pixel defining layer has a refractive index of 1.5 to 1.7 and a thickness of 2 um to 6 um. The organic emission layer (or "EL Layer") is disposed on the first electrode in a region corresponding to the opening and has a thickness of 200 nm to 400 nm and a refractive index of 1.8. The second electrode is disposed on the organic emission layer and the pixel defining layer.

Next, the first experimental example ("EGMM structure (cathode-EL layer elimination)") is the OLED display 1000 according to the first embodiment and includes a first electrode 710, a first inclined surface 51, a pixel defining layer 500, an organic emission layer 720, and a second electrode 730. The first electrode 710 has a thickness of 20 nm to 100 nm and has a refractive index of 1.7 to 1.9. The pixel defining layer 500 is disposed on the first electrode and includes a first inclined surface 511, a second inclined surface 512, a third inclined surface 513, and a fourth inclined surface 514 that form a second opening 510. The inclined surfaces are inclined about 34 degrees. The pixel defining layer 500 has a refractive index of 1.5 to 1.7 and a thickness of 2 um to 6 um. The organic emission layer is disposed on the first electrode 710 in a region corresponding to the second opening 510 and has a thickness of 200 nm to 400 nm and a refractive index of 1.8, and the second electrode 730 is disposed on the organic emission layer 720 and the pixel defining layer 500.

Rays emitted from the respective organic emission layers of the first experimental example ("EGMM structure (cathode-EL layer elimination)"), the first comparative example ("Ref"), and the second comparative example ("EGMM structure") were traced. A result of the ray tracing showed that luminous efficiency of the first experimental example ("EGMM structure (cathode-EL layer elimination)") was improved about 46.6% compared to the first comparative example (Ref) and improved by about 38.2% compared to the second comparative example ("EGMM structure"), the second comparative example having an 8.2% improvement in luminous efficiency over the first comparative example.

As described above, it can be observed that the luminous efficiency of the OLED display according to the first experimental example was improved compared to the OLED displays of the first and second comparative examples through comparison between the OLED display of the first experimental example ("EGMM structure (cathode-EL layer elimination)") and the OLED displays of the first and second comparative examples (e.g., in the "Result(efficiency)" row of FIG. 5).

As observed through the first experimental example of the present invention, the organic emission layer 720 and the second electrode 730 of the OLED display 1000 according to the first embodiment are disposed only on the third and fourth inclined surfaces 513 and 514 among the first to fourth inclined surfaces 511 to 514, and accordingly luminous efficiency can be improved.

Hereinafter, an OLED display according to a second embodiment will be described with reference to FIG. 6, FIG. 7, and FIG. 8.

Hereinafter, only characteristic components distinguished from the first embodiment will be described in more detail, and components omitted from the following description are substantially similar to corresponding components of the first embodiment. In addition, in the second embodiment, for the sake of convenience, like constituent elements will be described by using like reference numerals of the first embodiment.

Figure 6:
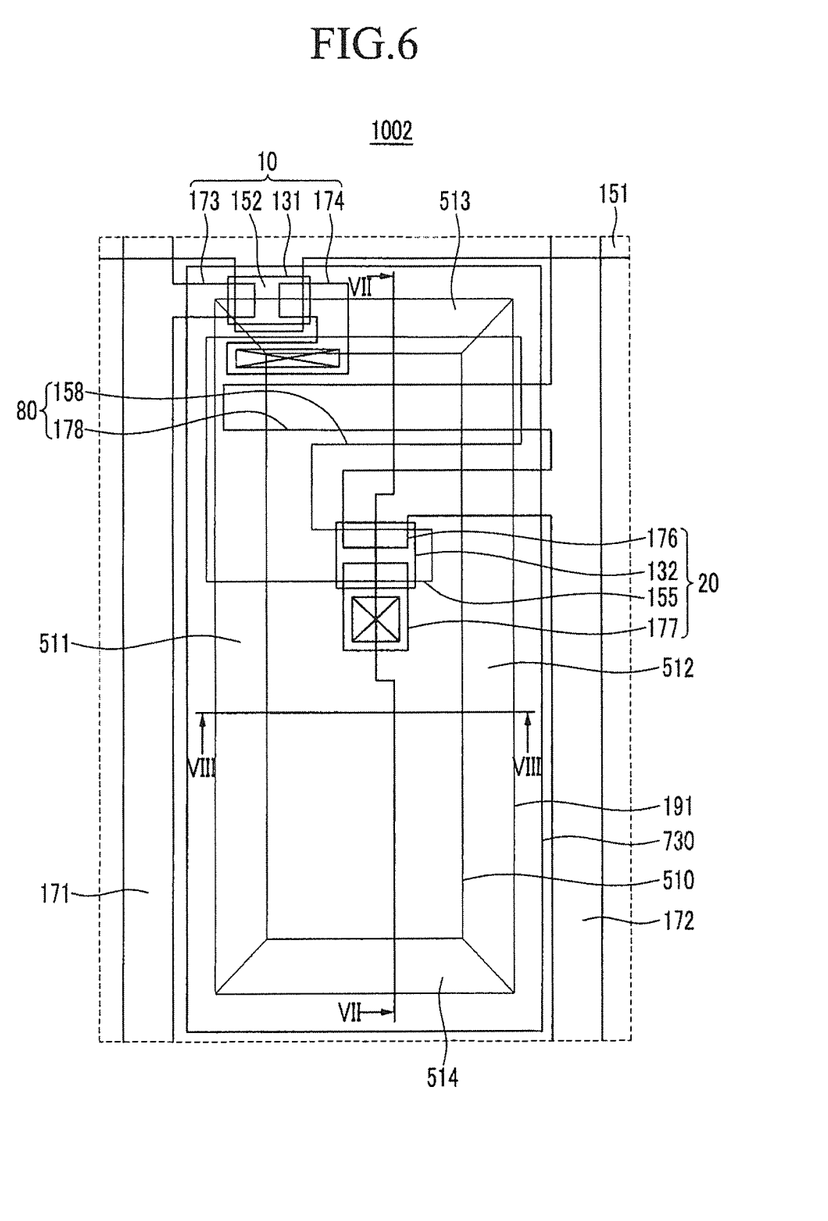
FIG. 6 is a schematic plan view of a pixel structure of an OLED display according to a second embodiment of the present invention.

FIG. 6 is a schematic plan view of a pixel structure of the OLED display according to the second embodiment. FIG. 7 is a cross-sectional view of the pixel structure of the second embodiment shown in FIG. 6, taken along the line VII-VII. FIG. 8 is a cross-sectional view of the pixel structure of the second embodiment shown in FIG. 6, taken along the line VIII-VIII.

Figure 7:
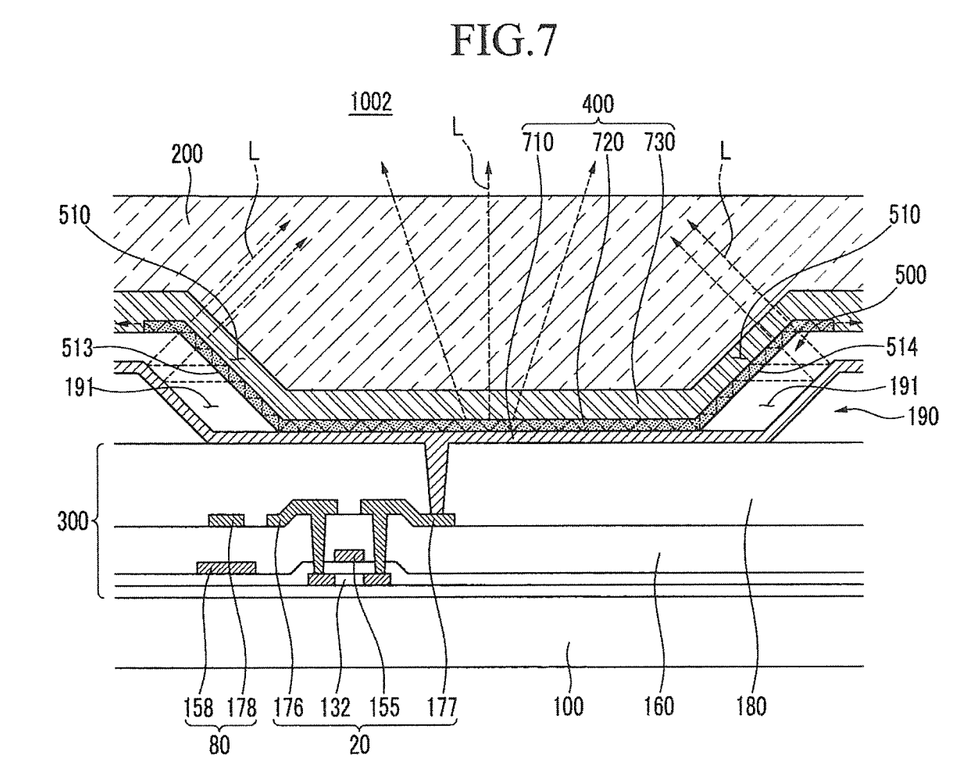
FIG. 7 is a cross-sectional view of the pixel structure of the second embodiment shown in FIG. 6, taken along the line VII-VII.
Figure 8:
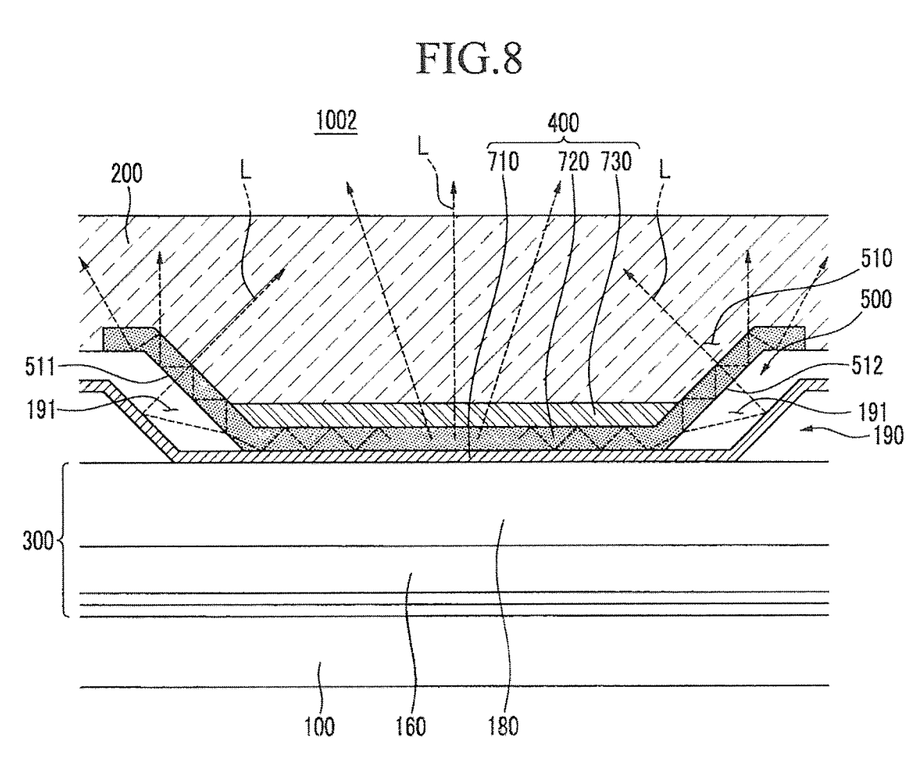
FIG. 8 is a cross-sectional view of the pixel structure of the second embodiment shown in FIG. 6, taken along the line VIII-VIII.

As shown in FIG. 6, FIG. 7, and FIG. 8, an organic emission layer 720 of an OLED display 1002 according to the second embodiment is disposed on a first inclined surface 511, a second inclined surface 512, a third inclined surface 513, and a fourth inclined surface 514 that form a second opening 510 of a pixel defining layer 500 while being disposed on a first electrode 710 in a region corresponding to the second opening 510.

The second electrode 730 is disposed on the organic emission layer 720 in a region corresponding to the second opening 510. The second electrode 730 covers (e.g., completely covers) the third and fourth inclined surfaces 513 and 514 among the first to fourth inclined surfaces 511 to 514 that form the second opening 510 of the pixel defining layer 500 (see, e.g., FIG. 7), and the second electrode 730 is not disposed on (or merely partially covers) the first and second inclined surfaces 511 and 512 (see, e.g., FIG. 8).

The organic emission layer 720 forming the organic light emitting diode 300 of the OLED display 1002 according to the second embodiment has a refractive index that is different from those of the first electrode 710, the pixel defining layer 500, and the second electrode 730 due to a material characteristic, and accordingly, the organic emission layer 720 functions like an optical fiber such that a part of light L emitted from the organic emission layer 720 is continuously reflected between the first electrode 710 and the second electrode 730 and then emitted toward the pixel defining layer 500 disposed in a side of the organic emission layer 720. The light L emitted toward the pixel defining layer 500 disposed in the side of the organic emission layer 720 is reflected by the first electrode 710 disposed on the second insulating layer 190 in a region corresponding to the first and second inclined surfaces 511 and 51 and then irradiated toward a center portion of the pixel because the second electrode 730 is disposed to completely cover only on the third inclined surface 513 and the fourth inclined surface 514. In this case, because the second electrode 730 is not disposed on the first inclined surface 511 and the second inclined surface 512, the light L reflected by the first electrode 710 is irradiated toward the center portion of the pixel without (or with reduced) luminance deterioration due to the presence of the second electrode 730, and accordingly, luminous efficiency of the OLED display 1002 can be improved.

In the OLED display 1002 according to the second embodiment, light L irradiated to the side of the organic emission layer 720 is reflected back to the center area of the pixel by the first electrode 710 without (or with reduced) luminance deterioration due to the second electrode 720 so that the luminous efficiency of the entire pixel can be improved.

Hereinafter, referring to FIG. 9, improvement of luminous efficiency of the OLED display 1002 according to the second embodiment can be observed through a second experimental example, the second experimental example will now be described. The second experimental example has the same configuration of the OLED display according to the second embodiment.

Figure 9:
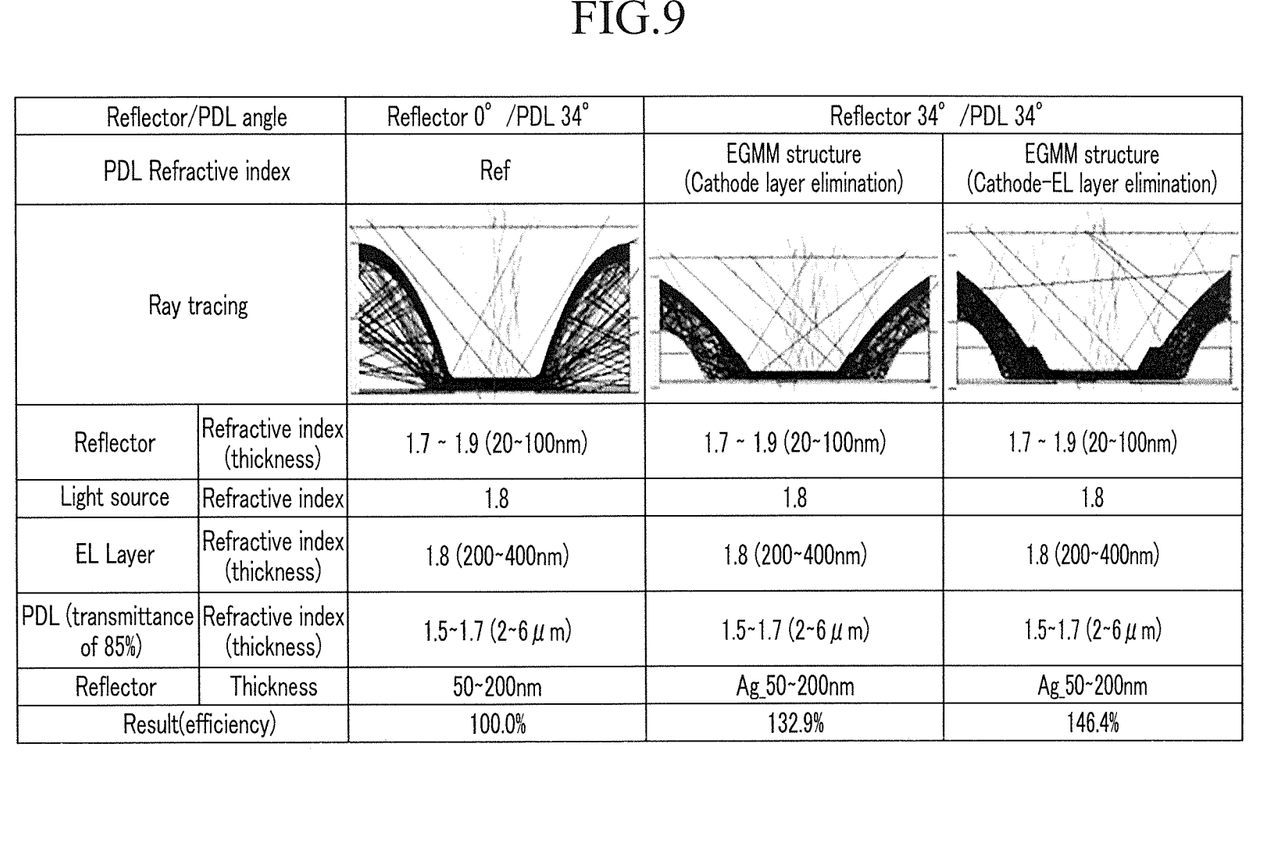
FIG. 9 is a table showing characteristics of a first experimental example, a second experimental example, and a first comparative example of structures of OLEDs.

FIG. 9 is a table illustrating the first experimental example, a second experimental example, and the first comparative example according to the present invention.

First, as shown in FIG. 9, the first Comparative Example (Ref) is a conventional flat OLED display, and includes a first electrode, a pixel defining layer, an organic emission layer, and a second electrode. The first electrode (or "Reflector") has a thickness of 20 nm to 100 nm and has a refractive index of 1.7 to 1.9. The pixel defining layer (PDL) is disposed on the first electrode, and includes a surface inclined 34 degrees, the surface forming an opening. The thickness of the pixel defining layer is 2 um to 6 um and a refractive index thereof is 1.5 to 1.7. The organic emission layer has a thickness of 200 nm to 400 nm and a refractive index of 1.8, and is disposed on the first electrode in a region corresponding to the opening. The second electrode is disposed on the organic emission layer and the pixel defining layer.

Next, the first experimental example (EGMM structure (cathode-EL layer elimination)) is the experimental example of the first embodiment. As such, a detailed description of the first experimental example will not be repeated.

Next, the second experimental example (EGMM structure (cathode layer elimination)) is the OLED display 1002 according to the second embodiment, and includes a first electrode having a thickness of 20 nm to 100 nm, a pixel defining layer 500 disposed on the first electrode, an organic emission layer 720 disposed on the first electrode 710 corresponding to the second opening 510, and a second electrode 730.

The first electrode has a refractive index of 1.7 to 1.9. The pixel defining layer 500 includes first to fourth inclined surfaces 511 to 514 inclined at about 34 degrees and forming a second opening 510, and has a refractive index of 1.5 to 1.7. The organic emission layer has a thickness of 200 nm to 400 nm and has a refractive index of 1.8. The second electrode 730 is disposed on the organic emission layer 720 and the pixel defining layer 500.

Rays emitted from the respective organic emission layers of the first experimental example (EGMM structure (cathode-EL layer elimination)), the second experimental example (EGMM structure (cathode layer elimination)), and the first comparative example (Ref) were traced. A result of the ray tracing showed that luminous efficiency of the second experimental example (EGMM structure (cathode layer elimination)) was improved about 32.9% compared to the first comparative example (Ref).

As described above, it can be observed that the luminous efficiency of the OLED display according to the second experimental example (EGMM structure (cathode-EL layer elimination)) was improved compared to the OLED display of the first comparative example (Ref) through comparison between the OLED display of the second experimental example and the OLED display of the first comparative example.

As observed in the second experimental example of the present invention, the second electrode 730 of the OLED display 1002 according to the second embodiment is disposed on (e.g., completely covers) only the third and fourth inclined surfaces 513 and 514 among the first to fourth inclined surfaces 511 to 514, and accordingly luminous efficiency can be improved.

Hereinafter, an OLED display according to a third embodiment will be described with reference to FIG. 10, FIG. 11, and FIG. 12.

Hereinafter, only characteristic components distinguished from the first embodiment will be described, and the components omitted from the description follow the first embodiment. In addition, in the third embodiment, for the sake of convenience, like elements will be described by using like reference numerals of the first embodiment.

Figure 10:
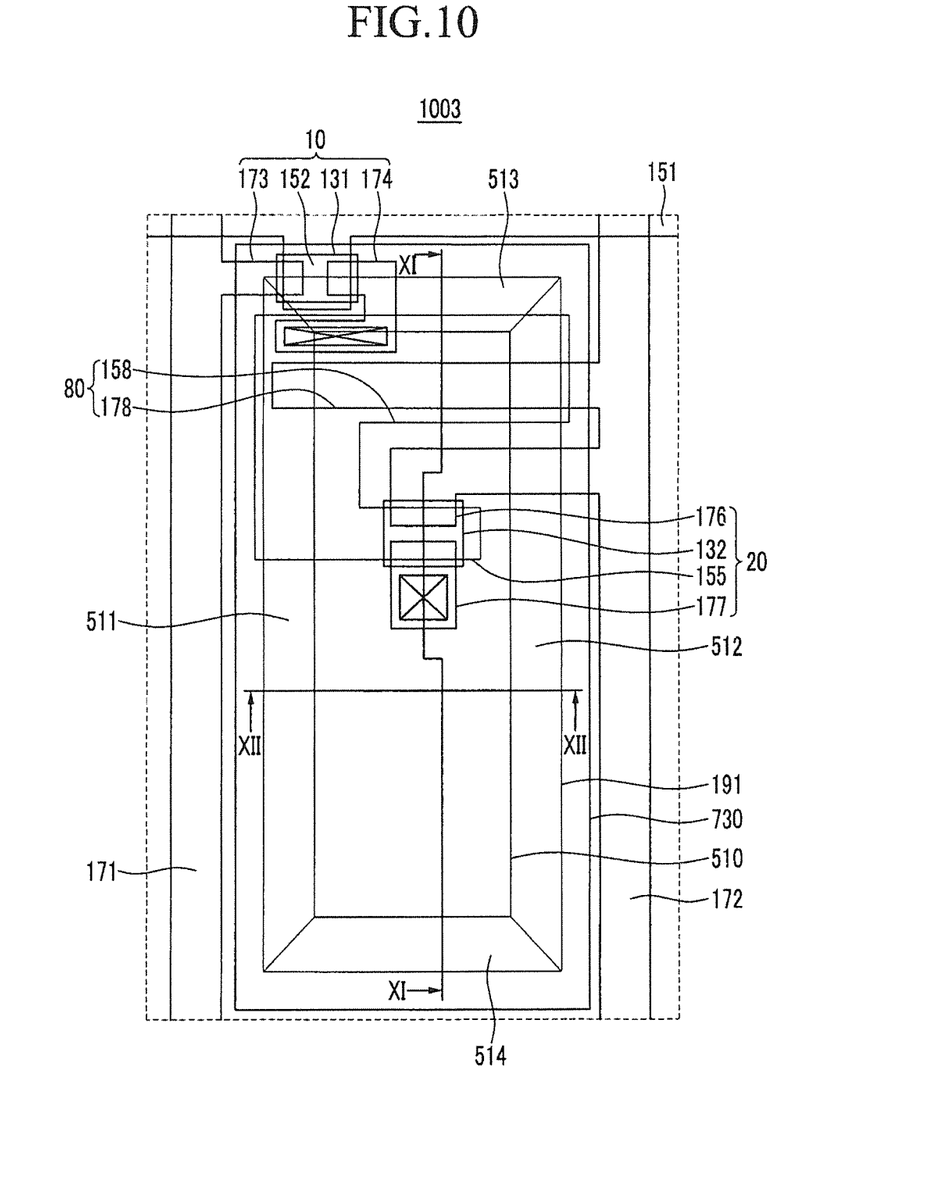
FIG. 10 is a schematic plan view of a pixel structure of an OLED display according to a third embodiment of the present invention.

FIG. 10 is a schematic plan view of a pixel structure of the OLED display according to the third embodiment. FIG. 11 is a cross-sectional view of FIG. 10, taken along the line XI-XI. FIG. 12 is a cross-sectional view of FIG. 10, taken along the line XII-XII.

Figure 11:
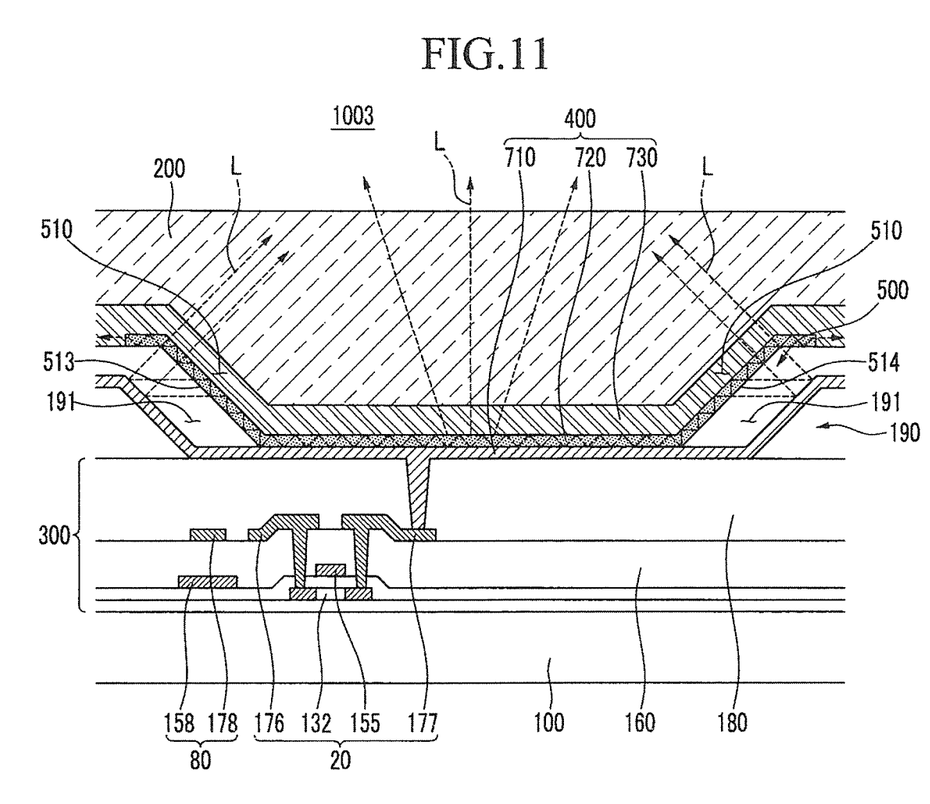
FIG. 11 is a cross-sectional view of the pixel structure of the third embodiment shown in FIG. 10, taken along the line XI-XI.
Figure 12:
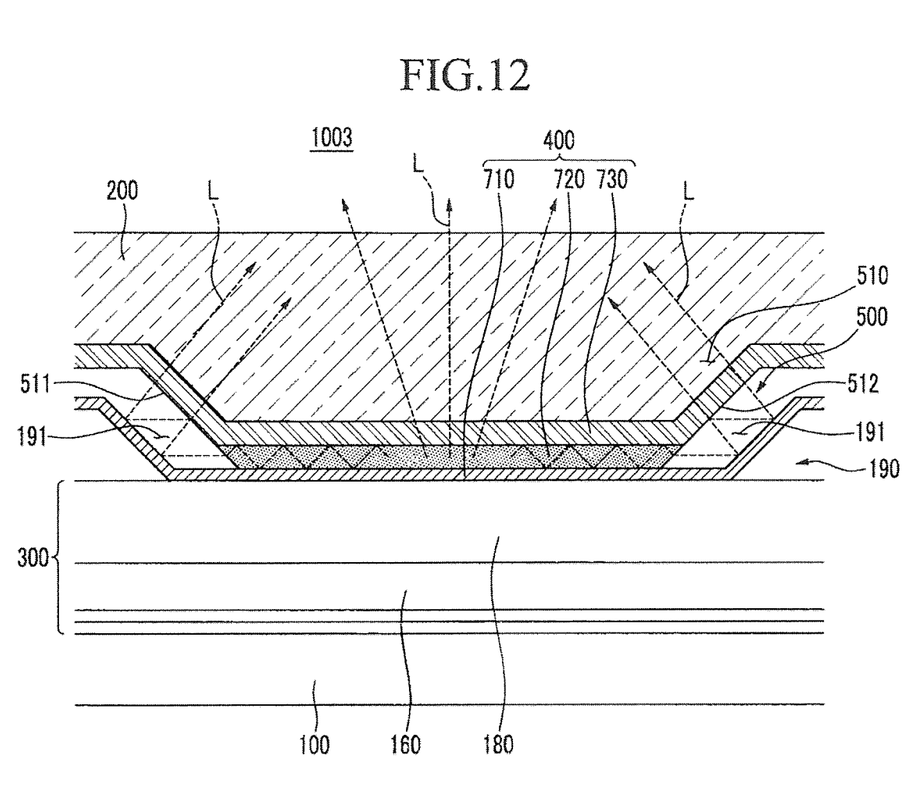
FIG. 12 is a cross-sectional view of the pixel structure of the third embodiment shown in FIG. 10, taken along the line XII-XII.

As shown in FIG. 10, FIG. 11, and FIG. 12, an organic emission layer 720 of an OLED display 1003 according to the third embodiment covers (e.g., completely covers) only the third and fourth inclined surfaces 513 and 514 among a first to fourth inclined surfaces 511 to 514 that form a second opening 510 of a pixel defining layer 500 while being disposed on the organic emission layer 720 corresponding to the second opening 510, and thus the second electrode 730 is not disposed on the first and second inclined surfaces 511 and 512.

The second electrode 730 is disposed on the organic emission layer 720 in a region corresponding to the second opening 510. The second electrode 730 is disposed on the first to fourth inclined surfaces 511 to 514 that form the second opening 510 of the pixel defining layer 500 and is also disposed on the organic emission layer 720 in a region corresponding to the second opening 510. The second electrode 730 may be formed in the shape of a plate and may be disposed on the entire substrate 100.

The organic emission layer 700 forming the organic light emitting diode 400 of the OLED display 1003 according to the third embodiment has a refractive index that is different from those of the first electrode 710, the pixel defining layer 500, and the second electrode 730 due to a material characteristic, and accordingly, the organic emission layer 720 functions like an optical fiber such that a part of light L emitted from the organic emission layer 720 is continuously reflected between the first electrode 710 and the second electrode 730 and then emitted toward the pixel defining layer 500 disposed in a side of the organic emission layer 720. The light L emitted to the pixel defining layer 500 disposed in the side of the organic emission layer 720 is reflected by the first electrode 710 disposed on the second insulating layer 190 in a region corresponding to the first and second inclined surfaces 511 and 51 and then irradiated toward a center portion of the pixel because the organic emission layer 720 and the second electrode 730 are disposed only on the third inclined surface 513 and the fourth inclined surface 514. In this case, because the organic emission layer 720 and the second electrode 730 are not disposed on the first inclined surface 511 and the second inclined surface 512, the light L reflected by the first electrode 710 is irradiated toward the center portion of the pixel without luminance deterioration due to the organic emission layer 720, and accordingly, luminous efficiency of the OLED display 1000 can be improved.

That is, in the OLED display 1003 according to the third embodiment, light L irradiated to the side of the organic emission layer 720 is reflected back to the center area of the pixel by the first electrode 710 without (or with reduced) luminance deterioration due to the organic emission layer 720 so that the luminous efficiency of the entire pixel can be improved.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

LISTING OF SOME REFERENCE NUMERALS substrate 100, thin film transistor 20, first insulation layer 180, first opening 191, second insulation layer 190, first electrode 710, second opening 510, pixel defining layer 500, organic emission layer 720, second electrode 730

What is claimed is:

1. An organic light emitting diode (OLED) display comprising:
   a substrate;
   a thin film transistor on the substrate;
   a first insulation layer on the thin film transistor;
   a second insulation layer on the first insulation layer, the second insulation layer having a first opening exposing a portion of the first insulation layer;
   a first electrode electrically connected with the thin film transistor and contacting the second insulation layer and contacting the first insulation layer through the first opening;
   a pixel defining layer disposed on the first electrode and having a second opening exposing a portion of the first electrode in a region corresponding to the first opening, the second opening being smaller than the first opening, wherein the pixel defining layer comprises a plurality of inclined surfaces forming the second opening;
   an organic emission layer on the first electrode in a region corresponding to the second opening, the organic emission layer covering at least one of the plurality of inclined surfaces of the pixel defining layer; and
   a second electrode on the organic emission layer in a region corresponding to the second opening.

2. The OLED display of claim 1, wherein at least one of the organic emission layer and the second electrode is disposed on fewer than all of the plurality of inclined surfaces.

3. The OLED display of claim 1, wherein the first electrode is a light reflective electrode and the second electrode is a light transmissive electrode.

4. The OLED display of claim 1, wherein the organic emission layer has a refractive index that is different from the refractive indexes of the first electrode, the pixel defining layer, and the second electrode.

5. The OLED display of claim 1, wherein the second opening is in a shape of a flat quadrangle, and
wherein the pixel defining layer forms the second opening and further comprises:
first and second inclined surfaces that are disposed opposite to each other; and
third and fourth inclined surfaces that are disposed opposite to each other.

6. The OLED display of claim 5, wherein the third inclined surface connects first ends of the first and second inclined surfaces, and the fourth inclined surface connects second ends of the first and second inclined surfaces.

7. The OLED display of claim 5, wherein the first and second inclined surfaces are longer than the third and fourth inclined surfaces.

8. The OLED display of claim 5, wherein the organic emission layer and the second electrode are disposed only on the third and fourth inclined surfaces among the first, second, third, and fourth inclined surfaces.

9. The OLED display of claim 5, wherein the second electrode is disposed only on the third and fourth inclined surfaces among the first, second, third, and fourth inclined surfaces.

10. The OLED display of claim 9, wherein the organic emission layer is disposed on the first, second, third, and fourth inclined surfaces.

11. The OLED display of claim 5, wherein the organic emission layer is disposed only on the third and fourth inclined surfaces among the first, second, third, and fourth inclined surfaces.

12. The OLED display of claim 11, wherein the second electrode is disposed on the first, second, third, and fourth inclined surfaces.

\* \* \* \* \*